(12) United States Patent
Gee et al.

(10) Patent No.: US 9,601,690 B1
(45) Date of Patent: Mar. 21, 2017

(54) SUB-OXIDE INTERFACE LAYER FOR TWO-TERMINAL MEMORY

(71) Applicant: Crossbar, Inc., Santa Clara, CA (US)

(72) Inventors: Harry Yue Gee, Santa Clara, CA (US); Mark Harold Clark, Santa Clara, CA (US); Steven Patrick Maxwell, Sunnyvale, CA (US); Sung Hyun Jo, Sunnyvale, CA (US); Natividad Vasquez, Jr., San Francisco, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/887,050

(22) Filed: Oct. 19, 2015

Related U.S. Application Data

(63) Continuation of application No. 14/027,045, filed on Sep. 13, 2013, now Pat. No. 9,166,163, and a
(Continued)

(51) Int. Cl.
*G11C 11/00* (2006.01)
*H01L 45/00* (2006.01)
*H01L 27/24* (2006.01)

(52) U.S. Cl.
CPC ........ *H01L 45/085* (2013.01); *H01L 27/2436* (2013.01); *H01L 45/1233* (2013.01);
(Continued)

(58) Field of Classification Search
CPC ............... H01L 45/085; H01L 45/1608; H01L 45/1253; H01L 27/2436
(Continued)

(56) References Cited

U.S. PATENT DOCUMENTS

| 680,652 A | 8/1901 | Leonard |
| 4,433,468 A | 2/1984 | Kawamata |
(Continued)

FOREIGN PATENT DOCUMENTS

| CN | 101131872 A | 2/2008 |
| CN | 101170132 A | 4/2008 |
(Continued)

OTHER PUBLICATIONS

Notice of Allowance dated Dec. 19, 2014 for U.S. Appl. No. 13/529,985, 9 pgs.
(Continued)

*Primary Examiner* — Viet Q Nguyen
(74) *Attorney, Agent, or Firm* — Amin, Turocy & Watson, LLP

(57) ABSTRACT

Provision of fabrication, construction, and/or assembly of a two-terminal memory device is described herein. The two-terminal memory device can include an active region with a silicon bearing layer, an interface layer, and an active metal layer. The interface layer can created comprising a non-stoichiometric sub-oxide that can be a combination of multiple silicon and/or silicon oxide layers with an aggregate chemical formula of $SiO_X$, where X can be a non-integer greater than zero and less than 2. The sub-oxide can be created in a variety of ways, including various techniques related to growing the sub-oxide, depositing the sub-oxide, or transforming an extant film into the sub-oxide.

20 Claims, 11 Drawing Sheets

Related U.S. Application Data continuation-in-part of application No. 13/525,096, filed on Jun. 15, 2012, now Pat. No. 9,058,865, application No. 14/887,050, which is a continuation-in-part of application No. 13/586,815, filed on Aug. 15, 2012, now Pat. No. 8,946,669, and a continuation-in-part of application No. 13/585,759, filed on Aug. 14, 2012, now Pat. No. 8,569,172, application No. 14/887,050, which is a continuation-in-part of application No. 13/912,136, filed on Jun. 6, 2013, now Pat. No. 9,209,396.

(60) Provisional application No. 61/786,100, filed on Mar. 14, 2013, provisional application No. 61/712,171, filed on Oct. 10, 2012, provisional application No. 61/786,058, filed on May 8, 2013, provisional application No. 61/503,477, filed on Jun. 30, 2011, provisional application No. 61/620,561, filed on Apr. 5, 2012.

(52) U.S. Cl.
CPC ........ *H01L 45/1253* (2013.01); *H01L 45/145* (2013.01); *H01L 45/1608* (2013.01)

(58) Field of Classification Search
USPC .............................................. 365/148; 257/4
See application file for complete search history.

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A * | 1/1997 | Endo ................ H01L 21/28282 257/324 |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A * | 3/2000 | Chang ................ H01L 21/2236 257/E21.143 |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 * | 8/2010 | Nickel ................ H01L 27/2472 257/E21.645 |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |

(56) References Cited

U.S. PATENT DOCUMENTS

| | | | |
|---|---|---|---|
| 7,835,170 B2 | 11/2010 | Bertin et al. | |
| 7,858,468 B2 | 12/2010 | Liu et al. | |
| 7,859,884 B2 | 12/2010 | Scheuerlein | |
| 7,869,253 B2 | 1/2011 | Liaw et al. | |
| 7,875,871 B2 | 1/2011 | Kumar et al. | |
| 7,881,097 B2 | 2/2011 | Hosomi et al. | |
| 7,883,964 B2 | 2/2011 | Goda et al. | |
| 7,897,953 B2 | 3/2011 | Liu | |
| 7,898,838 B2 | 3/2011 | Chen et al. | |
| 7,920,412 B2 | 4/2011 | Hosotani et al. | |
| 7,924,138 B2 | 4/2011 | Kinoshita et al. | |
| 7,927,472 B2 * | 4/2011 | Takahashi | G01B 11/0616 118/665 |
| 7,968,419 B2 | 6/2011 | Li et al. | |
| 7,972,897 B2 | 7/2011 | Kumar et al. | |
| 7,984,776 B2 | 7/2011 | Sastry et al. | |
| 8,004,882 B2 | 8/2011 | Katti et al. | |
| 8,018,760 B2 | 9/2011 | Muraoka et al. | |
| 8,021,897 B2 | 9/2011 | Sills et al. | |
| 8,045,364 B2 | 10/2011 | Schloss et al. | |
| 8,054,674 B2 | 11/2011 | Tamai et al. | |
| 8,054,679 B2 | 11/2011 | Nakai et al. | |
| 8,067,815 B2 | 11/2011 | Chien et al. | |
| 8,071,972 B2 | 12/2011 | Lu et al. | |
| 8,084,830 B2 | 12/2011 | Kanno et al. | |
| 8,088,688 B1 | 1/2012 | Herner | |
| 8,097,874 B2 | 1/2012 | Venkatasamy et al. | |
| 8,102,018 B2 | 1/2012 | Bertin et al. | |
| 8,102,698 B2 | 1/2012 | Scheuerlein | |
| 8,143,092 B2 | 3/2012 | Kumar et al. | |
| 8,144,498 B2 | 3/2012 | Kumar et al. | |
| 8,164,948 B2 | 4/2012 | Katti et al. | |
| 8,168,506 B2 | 5/2012 | Herner | |
| 8,183,553 B2 | 5/2012 | Phatak et al. | |
| 8,187,945 B2 | 5/2012 | Herner | |
| 8,198,144 B2 | 6/2012 | Herner | |
| 8,207,064 B2 | 6/2012 | Bandyopadhyay et al. | |
| 8,227,787 B2 | 7/2012 | Kumar et al. | |
| 8,231,998 B2 | 7/2012 | Sastry et al. | |
| 8,233,308 B2 | 7/2012 | Schricker et al. | |
| 8,237,146 B2 | 8/2012 | Kreupl et al. | |
| 8,243,542 B2 | 8/2012 | Bae et al. | |
| 8,258,020 B2 | 9/2012 | Herner | |
| 8,265,136 B2 | 9/2012 | Hong et al. | |
| 8,274,130 B2 * | 9/2012 | Mihnea | G11C 13/0007 257/209 |
| 8,274,812 B2 | 9/2012 | Nazarian et al. | |
| 8,305,793 B2 | 11/2012 | Majewski et al. | |
| 8,315,079 B2 | 11/2012 | Kuo et al. | |
| 8,320,160 B2 | 11/2012 | Nazarian | |
| 8,351,241 B2 | 1/2013 | Lu et al. | |
| 8,369,129 B2 | 2/2013 | Fujita et al. | |
| 8,369,139 B2 | 2/2013 | Liu et al. | |
| 8,374,018 B2 | 2/2013 | Lu | |
| 8,385,100 B2 | 2/2013 | Kau et al. | |
| 8,389,971 B2 | 3/2013 | Chen et al. | |
| 8,394,670 B2 | 3/2013 | Herner | |
| 8,399,307 B2 | 3/2013 | Herner | |
| 8,441,835 B2 | 5/2013 | Jo et al. | |
| 8,456,892 B2 | 6/2013 | Yasuda | |
| 8,466,005 B2 * | 6/2013 | Pramanik | H01L 27/101 257/E21.613 |
| 8,467,226 B2 | 6/2013 | Bedeschi et al. | |
| 8,467,227 B1 | 6/2013 | Jo | |
| 8,502,185 B2 | 8/2013 | Lu et al. | |
| 8,569,104 B2 | 10/2013 | Pham et al. | |
| 8,587,989 B2 | 11/2013 | Manning et al. | |
| 8,619,459 B1 | 12/2013 | Nguyen et al. | |
| 8,658,476 B1 | 2/2014 | Sun et al. | |
| 8,659,003 B2 | 2/2014 | Herner et al. | |
| 8,675,384 B2 | 3/2014 | Kuo et al. | |
| 8,693,241 B2 | 4/2014 | Kim et al. | |
| 8,853,759 B2 * | 10/2014 | Lee | G11C 13/0007 257/295 |
| 8,854,859 B2 | 10/2014 | Chung | |
| 8,934,294 B2 | 1/2015 | Kim et al. | |
| 8,946,667 B1 | 2/2015 | Clark et al. | |
| 8,946,673 B1 | 2/2015 | Kumar | |
| 8,947,908 B2 | 2/2015 | Jo | |
| 8,999,811 B2 * | 4/2015 | Endo | H01L 29/4908 257/E21.006 |
| 9,093,635 B2 * | 7/2015 | Kim | H01L 45/06 |
| 9,166,163 B2 * | 10/2015 | Gee | H01L 45/085 |
| 9,209,396 B2 * | 12/2015 | Narayanan | H01L 45/1608 |
| 2002/0048940 A1 | 4/2002 | Derderian et al. | |
| 2003/0006440 A1 | 1/2003 | Uchiyama | |
| 2003/0036238 A1 | 2/2003 | Toet et al. | |
| 2003/0052330 A1 | 3/2003 | Klein | |
| 2003/0141565 A1 | 7/2003 | Hirose et al. | |
| 2003/0174574 A1 | 9/2003 | Perner et al. | |
| 2003/0194865 A1 | 10/2003 | Gilton | |
| 2003/0206659 A1 | 11/2003 | Hamanaka | |
| 2004/0026682 A1 | 2/2004 | Jiang | |
| 2004/0036124 A1 * | 2/2004 | Vyvoda | H01L 27/0688 257/382 |
| 2004/0159835 A1 * | 8/2004 | Krieger | B82Y 10/00 257/40 |
| 2004/0170040 A1 | 9/2004 | Rinerson et al. | |
| 2004/0192006 A1 | 9/2004 | Campbell et al. | |
| 2004/0194340 A1 | 10/2004 | Kobayashi | |
| 2004/0202041 A1 | 10/2004 | Hidenori | |
| 2005/0019699 A1 | 1/2005 | Moore | |
| 2005/0020510 A1 | 1/2005 | Benedict | |
| 2005/0029587 A1 | 2/2005 | Harshfield | |
| 2005/0041498 A1 | 2/2005 | Resta et al. | |
| 2005/0052915 A1 | 3/2005 | Herner et al. | |
| 2005/0062045 A1 | 3/2005 | Bhattacharyya | |
| 2005/0073881 A1 | 4/2005 | Tran et al. | |
| 2005/0101081 A1 | 5/2005 | Goda et al. | |
| 2005/0175099 A1 | 8/2005 | Sarkijarvi et al. | |
| 2006/0017488 A1 | 1/2006 | Hsu | |
| 2006/0028895 A1 | 2/2006 | Taussig et al. | |
| 2006/0054950 A1 | 3/2006 | Baek et al. | |
| 2006/0134837 A1 | 6/2006 | Subramanian et al. | |
| 2006/0154417 A1 | 7/2006 | Shinmura et al. | |
| 2006/0215445 A1 | 9/2006 | Baek et al. | |
| 2006/0231910 A1 | 10/2006 | Hsieh et al. | |
| 2006/0246606 A1 | 11/2006 | Hsu et al. | |
| 2006/0268594 A1 | 11/2006 | Toda | |
| 2006/0279979 A1 | 12/2006 | Lowrey et al. | |
| 2006/0281244 A1 | 12/2006 | Ichige et al. | |
| 2006/0286762 A1 | 12/2006 | Tseng et al. | |
| 2007/0008773 A1 | 1/2007 | Scheuerlein | |
| 2007/0015348 A1 | 1/2007 | Hsu et al. | |
| 2007/0025144 A1 | 2/2007 | Hsu et al. | |
| 2007/0035990 A1 | 2/2007 | Hush | |
| 2007/0042612 A1 * | 2/2007 | Nishino | C23C 16/56 438/785 |
| 2007/0045615 A1 | 3/2007 | Cho et al. | |
| 2007/0069119 A1 | 3/2007 | Appleyard et al. | |
| 2007/0087508 A1 | 4/2007 | Herner et al. | |
| 2007/0090425 A1 | 4/2007 | Kumar et al. | |
| 2007/0091685 A1 | 4/2007 | Guterman et al. | |
| 2007/0105284 A1 | 5/2007 | Herner et al. | |
| 2007/0105390 A1 | 5/2007 | Oh | |
| 2007/0133250 A1 | 6/2007 | Kim | |
| 2007/0133270 A1 | 6/2007 | Jeong et al. | |
| 2007/0159869 A1 | 7/2007 | Baek et al. | |
| 2007/0159876 A1 | 7/2007 | Sugibayashi et al. | |
| 2007/0171698 A1 | 7/2007 | Hoenigschmid et al. | |
| 2007/0205510 A1 | 9/2007 | Lavoie et al. | |
| 2007/0228414 A1 | 10/2007 | Kumar et al. | |
| 2007/0284575 A1 | 12/2007 | Li et al. | |
| 2007/0290186 A1 | 12/2007 | Bourim et al. | |
| 2007/0291527 A1 | 12/2007 | Tsushima et al. | |
| 2007/0295950 A1 | 12/2007 | Cho et al. | |
| 2007/0297501 A1 | 12/2007 | Hussain et al. | |
| 2008/0002481 A1 | 1/2008 | Gogl et al. | |
| 2008/0006907 A1 | 1/2008 | Lee et al. | |
| 2008/0007987 A1 | 1/2008 | Takashima | |
| 2008/0019163 A1 | 1/2008 | Hoenigschmid et al. | |
| 2008/0043521 A1 | 2/2008 | Liaw et al. | |
| 2008/0048164 A1 | 2/2008 | Odagawa | |
| 2008/0083918 A1 | 4/2008 | Aratani et al. | |

(56) References Cited

U.S. PATENT DOCUMENTS

| | | |
|---|---|---|
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0025675 A1* | 2/2010 | Yamazaki .......... H01L 27/3241 257/43 |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1* | 2/2010 | Hooker .......... H01L 21/823842 257/369 |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1* | 6/2011 | Nishihara .......... G11B 7/24038 428/697 |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |

(56) References Cited

U.S. PATENT DOCUMENTS

| | | |
|---|---|---|
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1* | 1/2014 | Kim ............... H01L 29/78 257/288 |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1* | 5/2014 | Gee ............... H01L 45/085 257/2 |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1* | 9/2014 | Jo ............... H01L 45/1253 365/148 |
| 2014/0269002 A1* | 9/2014 | Jo ............... H01L 45/145 365/148 |
| 2014/0312296 A1 | 10/2014 | Jo et al. |
| 2014/0335675 A1* | 11/2014 | Narayanan ......... H01L 45/1608 438/382 |
| 2015/0070961 A1 | 3/2015 | Katayama et al. |
| 2015/0228334 A1 | 8/2015 | Nazarian et al. |
| 2016/0111640 A1* | 4/2016 | Chang ............... H01L 45/1233 257/4 |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 A | 1/2008 |
| JP | 2008147343 A | 6/2008 |
| JP | 2009043873 A | 2/2009 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 20090051206 A | 5/2009 |
| KR | 20110014248 A | 2/2011 |
| WO | 3034498 A1 | 4/2003 |
| WO | 2005124787 A2 | 12/2005 |
| WO | 2009005699 A1 | 1/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | 2011133138 A1 | 10/2011 |

OTHER PUBLICATIONS

Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S Appl. No. 14/509,967 dated Feb. 17, 2016, 18 pages.
Notice of Allowance for U.S Appl. No. 14/509,967 dated Jun. 6, 2016, 96 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Zankovych S., et al., "Nanoimprint Lithography: Challenges and Prospects," Nanotechnology, 2001, vol. 12, pp. 91-95.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 13, 2010.
Notice of Allowance mailed Feb. 6, 2013 for U.S. Appl. No. 13/118,258, filed May 27, 2011.
Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.

(56) References Cited

OTHER PUBLICATIONS

Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087, filed Sep. 29, 2010.
Notice of Allowance mailed May 11, 2012 for U.S. Appl. No. 12/939,824, filed Nov. 4, 2010.
Notice of Allowance mailed Mar. 12, 2012 for U.S. Appl. No. 12/913,719, filed Oct. 27, 2010.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.
Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 16, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Notice of Allowance mailed Mar. 17, 2014 for U.S. Appl. No. 13/592,224, filed Aug. 22, 2012.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Notice of Allowance mailed Sep. 17, 2014 for U.S. Appl. No. 13/960,735, filed Aug. 6, 2013.
Notice of Allowance mailed Sep. 17, 2014 for U.S. Appl. No. 13/462,653, filed May 2, 2012.
Notice of Allowance mailed Sep. 18, 2012 for U.S. Appl. No. 12/900,232, filed Oct. 7, 2010.
Notice of Allowance mailed Sep. 18, 2014 for U.S. Appl. No. 13/920,021, filed Jun. 17, 2013.
Notice of Allowance mailed Sep. 18, 2014 for U.S. Appl. No. 13/586,815, filed Aug. 15, 2012.
Notice of Allowance mailed Jun. 19, 2012 for U.S. Appl. No. 12/861,650, filed Aug. 23, 2010.
Notice of Allowance mailed Sep. 19, 2013 for U.S. Appl. No. 13/585,759, filed Aug. 14, 2012.
Notice of Allowance mailed Apr. 2, 2013 for U.S. Appl. No. 13/149,757, filed May 31, 2011.
Notice of Allowance mailed Feb. 10, 2015 for U.S. Appl. No. 13/525,096, filed Jun. 15, 2012.
Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Notice of Allowance mailed Oct. 21, 2014 for U.S. Appl. No. 13/426,869, filed Mar. 22, 2012.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 23, 2013 for U.S. Appl. No. 13/417,135, filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.

(56) References Cited

OTHER PUBLICATIONS

Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Written Opinion for Application No. PCT/US2009/060023, mailed on May 18, 2010, 3 pages.
Written Opinion for Application No. PCT/US2009/061249, mailed on May 19, 2010, 3 pages.
Written Opinion for Application No. PCT/US2011/040090, mailed on Feb. 17, 2012, 6 pages.
Written Opinion for Application No. PCT/US2011/045124, mailed on May 29, 2012, 5 pages.
Written Opinion for Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Office Action dated Aug. 23, 2016 for U.S. Appl. No. 14/613,585, 9 pages.
Office Action for U.S Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Office Action mailed Oct. 3, 2013 for U.S. Appl. No. 13/921,157, filed Jun. 18, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Apr. 6, 2015 for U.S. Appl. No. 14/034,390, filed Sep. 23, 2013.
Office Action mailed Dec. 6, 2013 for U.S. Appl. No. 13/564,639, filed Aug. 1, 2012.
Office Action mailed Dec. 6, 2013 for U.S. Appl. No. 13/960,735, filed Aug. 6, 2013.
Office Action mailed Feb. 6, 2014 for U.S. Appl. No. 13/434,567, filed Mar. 29, 2012.
Office Action mailed Mar. 6, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S. Appl. No. 13/436,714, filed Mar. 30, 2012.
Office Action mailed Mar. 7, 2013 for U.S. Appl. No. 13/651,169, filed Oct. 12, 2012.
Office Action mailed May 7, 2013 for U.S. Appl. No. 13/585,759, filed Aug. 14, 2012.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Aug. 9, 2013 for U.S. Appl. No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action dated Aug. 12, 2016 for U.S. Appl. No. 14/667,346, 27 pages.
Office Action mailed Mar. 12, 2014 for U.S. Appl. No. 13/167,920, filed Jun. 24, 2011.
Office Action mailed Sep. 12, 2014 for U.S. Appl. No. 13/426,869, filed Mar. 22, 2012.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action dated Aug. 12, 2016 for U.S. Appl. No. 14/613,301, 43 pages.
Office Action mailed Mar. 14, 2012 for U.S. Appl. No. 12/815,369, filed Jun. 14, 2010.
Office Action mailed Mar. 14, 2014 for U.S. Appl. No. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Advisory Action mailed Jun. 8, 2012 for U.S. Appl. No. 12/835,704, filed Jul. 13, 2010.
Avila A., et al., "Switching in Coplanar Amorphous Hydrogenated Silicon Devices," Solid-State Electronics, 2000, vol. 44 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.

(56) References Cited

OTHER PUBLICATIONS

Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 812-813.
Dey S.K., "Electrothermal Model of Switching in Amorphous Silicon Films," Journal of Vacuum Science & Technology , 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Office Action for Application No. 11005649.6 dated Dec. 1, 2014, 2 pages.
European Office Action for Application No. 11005649.6 dated Nov. 17, 2015, 5 pages.
European Office Action for Application No. EP11005207.3 dated Aug. 8, 2012, 4 pages.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.

Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hu., et al., "Area-Dependent Switching in Thin Film-Silicon Devices," Materials Research Society Symposium Proceedings, 2003, vol. 762, pp. A 18.3.1-A 18.3.6.
Hu., et al., "Switching and Filament Formation in hot-wire CVD p-type a-Si:H devices," Thin Solid Films, Science Direct, 2003, vol. 430, pp. 249-252.
Hudgens S., et al., "Overview of Phase-Change Chalcogenide Nonvolatile Memory Technology", MRS Bulletin, Nov. 2004, pp. 829-832. Retrieved from the Internet.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 3 pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.

(56) References Cited

OTHER PUBLICATIONS

Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Jo S.H. et al., "High-Density Crossbar Arrays Based on a Si Memristive System", Supporting Information, 2009, pp. 1-4.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, Dec. 29, 2008, pp. 1-4, vol. 9, No. 1, Department of Electrical Engineering and Computer Science, the University of Michigan, Ann Arbor, Michigan.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Sep. 9, 2016. https://www.yumpu.com/en/document/view/31750386/diffusion-1-color.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Office Action mailed Mar. 17, 2015 for U.S. Appl. No. 14/573,770.
Office Action mailed Apr. 19, 2011 for U.S. Appl. No. 12/582,086, filed Oct. 20, 2009.
Office Action mailed Aug. 19, 2013 for U.S. Appl. No. 13/585,759, filed Aug. 14, 2012.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S. Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S Appl. No. 13/156,232.
Office Action mailed Aug. 27, 2013 for U.S. Appl. No. 13/436,714, filed Mar. 30, 2012.
Office Action mailed Dec. 27, 2013 for U.S. Appl. No. 13/525,096, filed Jun. 15, 2012.
Office Action mailed Mar. 27, 2012 for U.S. Appl. No. 13/314,513, filed Dec. 8, 2011.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.

(56) References Cited

OTHER PUBLICATIONS

Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.
Office Action mailed Sep. 30, 2013 for U.S. Appl. No. 13/189,401, filed Jul. 22, 2011.
Office Action mailed Sep. 30, 2013 for U.S. Appl. No. 13/462,653, filed May 2, 2012.
Office Action mailed Apr. 8, 2016 for U.S. Appl. No. 14/573,770.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching in Amorphous Silicon Devices," Journal of Non- Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory- The Plastic Path to Better Data Storage, Technology Review, Sep. 2002, p. 31. Retrieved from the Internet.
Suehle J.S., et al., "Temperature Dependence of Soft Breakdown and Wear-out in Sub-3 Nm SiO2 Films", 38th Annual International Reliability Physics Symposium, San Jose, California, 2000, pp. 33-39.
Sune J., et al., "Nondestructive Multiple Breakdown Events in Very Thin SiO2 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Notice of Allowance dated Sep. 14, 2016 for U.S. Appl. No. 14/588,202, 119 pages.
Notice of Allowance dated Oct. 7, 2016 for U.S. Appl. No. 14/213,953, 43 pages.
Notice of Allowance for U.S. Appl. No. 14/509,967 dated Oct. 24, 2016, 42 pages.
Notice of Allowance for U.S. Appl. No. 14/383,079 dated Aug. 17, 2016, 71 pages.
Notice of Allowance for U.S. Appl. No. 14/611,022 dated Oct. 26, 2016, 41 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S. Appl. No. 14/597,151 dated Oct. 20, 2016, 52 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Office Action for U.S Appl. No. 14/588,136 dated Nov. 2, 2016, 132 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.

* cited by examiner

SUB-OXIDE INTERFACE LAYER FOR TWO-TERMINAL MEMORY

CROSS-REFERENCE TO RELATED APPLICATIONS

This application is a continuation of U.S. patent application Ser. No. 14/027,045 filed on Sep. 13, 2013 that claims the benefit of U.S. provisional patent application No. 61/786,100 filed on Mar. 14, 2013, and the benefit of U.S. provisional patent application No. 61/712,171 filed on Oct. 10, 2012 and the benefit of U.S. provisional patent application No. 61/786,058 filed on Mar. 14, 2013, which U.S. patent application is a continuation-in-part of U.S. patent application Ser. No. 13/525,096 filed Jun. 15, 2012 that claims the benefit of U.S. provisional patent application No. 61/503,477 filed on Jun. 30, 2011, and which is a continuation-in-part of U.S. patent application Ser. No. 13/586,815 filed Aug. 15, 2012 that claims the benefit of U.S. provisional patent application No. 61/620,561 filed on Apr. 5, 2012, and which is a continuation-in-part of U.S. patent application Ser. No. 13/585,759 filed Aug. 14, 2012, and which is a continuation-in-part of U.S. patent application Ser. No. 13/912,136 filed on Jun. 6, 2013 that claims the benefit of U.S. provisional patent application No. 61/786,058 filed on Mar. 14, 2013. The respective entireties of these applications are hereby incorporated herein by reference and for all purposes.

TECHNICAL FIELD

This disclosure generally relates to semiconductor fabrication, and more particularly to creating a sub-oxide for two-terminal memory cells with suitable characteristics to operate as an interface layer.

BACKGROUND

Resistive-switching memory represents a recent innovation within the field of integrated circuit technology. While much of resistive-switching memory technology is in the development stage, various technological concepts for resistive-switching memory have been demonstrated by the inventors and are in one or more stages of verification to prove or disprove associated theories or techniques. The inventors believe that resistive-switching memory technology shows compelling evidence to hold substantial advantages over competing technologies in the semiconductor electronics industry.

The inventors believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventors believe that arrays of many such memory cells can provide many bits of digital memory storage.

The inventors have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Systems and methods disclosed herein relate to fabrication of a two-terminal memory device with an interface layer comprising a silicon sub-oxide. For example, a memory fabrication component can facilitate fabrication of a two-terminal memory cell with an active region comprising a silicon bearing layer, an interface layer comprising a non-stoichiometric sub-oxide (e.g., $SiO_x$, $0<x<2$; $Si_xGe_yO_z$ $x\geq0$, $y\geq0$, $z\geq0$, $x+y\leq z\leq 2*(x+y)$, or the like) situated atop the silicon bearing layer, and an active metal layer situated atop the interface layer. The memory fabrication component can include a creation component and a sealing component. The creation component can be configured to facilitate creation of the interface layer during a formation period. Said creation can be according to one or more of many distinct techniques. The interface layer that comprises the sub-oxide can have a thickness that is less than about eight nanometers. The sealing component can be configured to facilitate deposition of the active metal layer in response to expiration of the formation period.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

In two-terminal memory cells, particularly resistive-switching memory cells, the portions of the cell between the two terminals are denoted herein as the active region of the cell. This active region can include an interface layer between a silicon bearing layer and an active metal layer, all of which are further detailed herein. In some embodiments, the silicon bearing layer can be a conductive silicon bearing layer. The interface layer plays a significant role in the switching properties of a two-terminal memory cell (e.g., a resistive-switching memory cell such as a resistive random access memory (RRAM) cell). In some memory cells, the interface layer is composed of amorphous silicon, that is, a semiconductor material composed of silicon or a derivative of silicon that is in an amorphous state. The inventors have proposed that the interface layer can be composed of a silicon sub-oxide that is in addition to or alternative to the amorphous silicon. The sub-oxide can be a mixture of many different silicon-based elements or oxides, such as silicon, silicon monoxide, and/or silicon dioxide. In the aggregate, this sub-oxide can exhibit desirable characteristics as an interface layer of a two-terminal memory device, and can be represented with a chemical formula that is a function of the various different elements or oxides. For example, as $SiO_x$, where X can be a non-integer and can greater than zero and less than 2, as $Si_xGe_yO_z$, where x≥0, y≥0, z≥0, x+y≤z≤2 (x+y), or the like.

Figure 5:
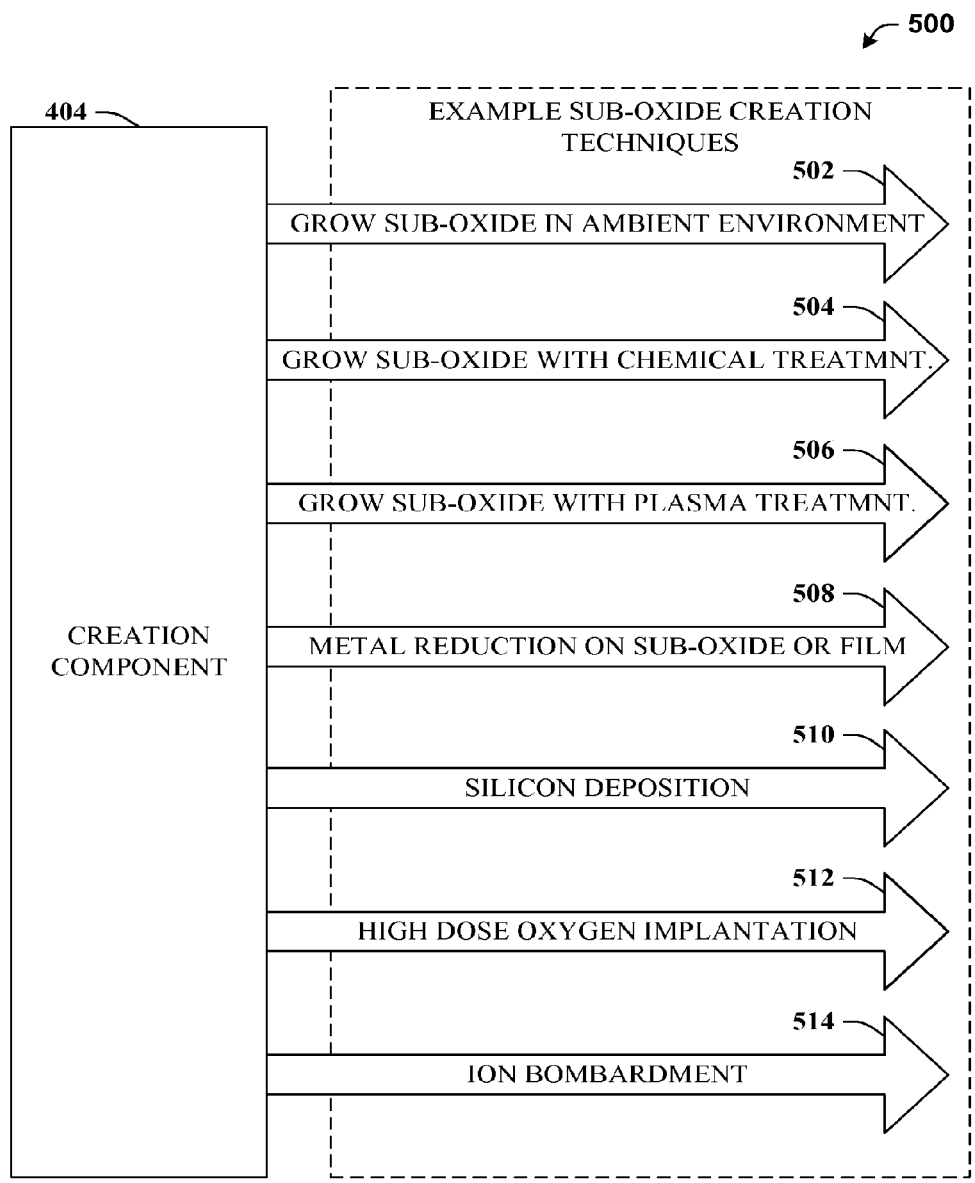
FIG. 5 illustrates a block diagram of an example creation component in more detail that can provide for numerous example silicon sub-oxide creation techniques in accordance with certain embodiments of this disclosure.

The interface layer and/or sub-oxide can be created in a variety of ways, numerous examples of which are provided with reference to FIG. 5. For example, the sub-oxide can be grown, deposited, or an existing film or oxide (or sub-oxide) can be transformed by a particular treatment or technique. In some cases, various techniques can be utilized in combination with other techniques to create the sub-oxide. In some embodiments, the sub-oxide can be created by using material included in the silicon bearing layer or another material that is in the interface layer such as a grown or deposited film which can be an oxide or another sub-oxide, and can be in combination with an amorphous silicon material.

Given the numerous techniques provided herein for creating the sub-oxide, the inventors believe an associated memory cell as well as a memory array (e.g., a crossbar array) can be constructed with target characteristics to suit many practical applications, which is further detailed in connection with FIGS. 2-3B. Further, memory fabricators are afforded a range of options to select a technique that is most compatible with existing facilities, equipment, designs, logistics, or business strategies.

Example of Creating a Silicon Sub-Oxide for Two-Terminal Memory

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Figure 1A:
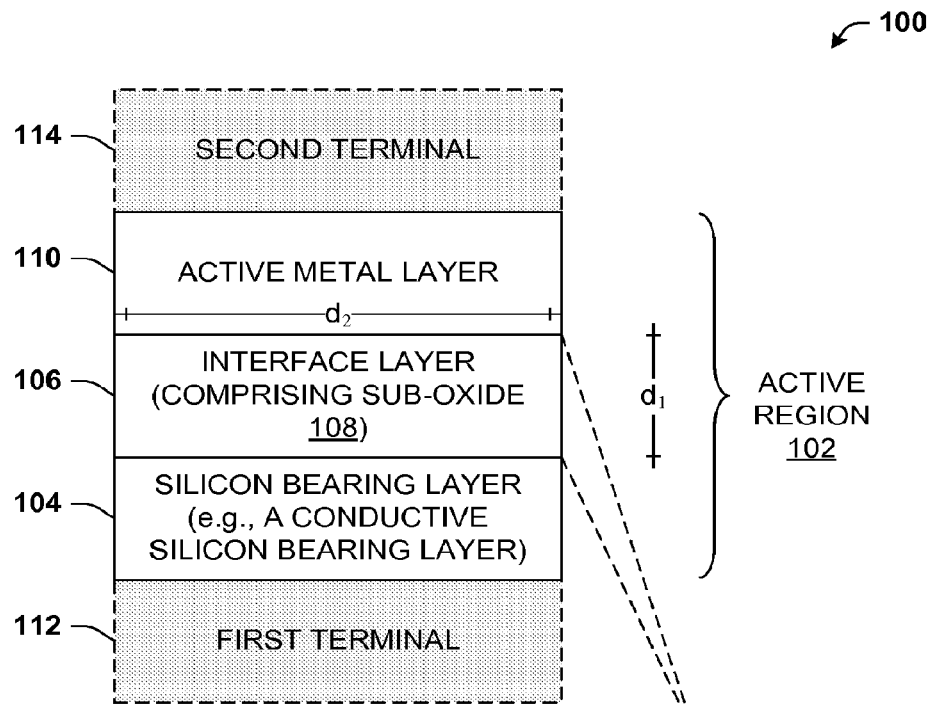
FIGS. 1A and 1B illustrate a block diagram of an example two-terminal memory cell or device in accordance with certain embodiments of this disclosure.
Figure 1B:
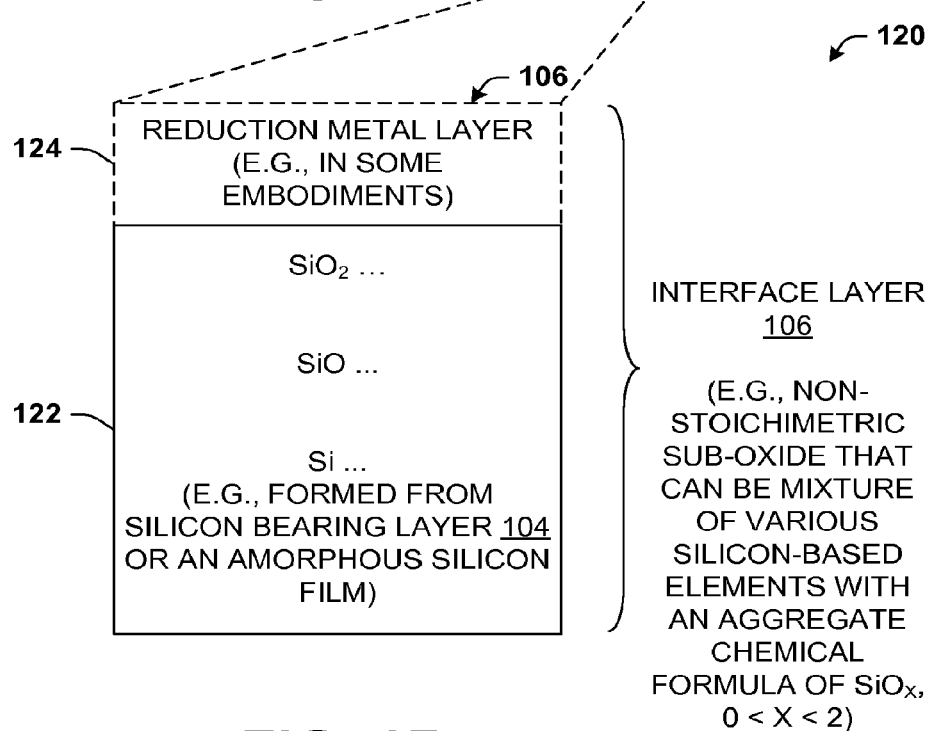

Referring initially to FIG. 1A, an example two-terminal memory device 100 is depicted. Device 100 can be a resistive-switching memory device such as a resistive random access memory (RRAM) device, for which certain illustrative characteristics or aspects are provided with reference to FIGS. 2-3B. Device 100 may be formed on top of an insulating substrate upon which one or more CMOS devices have been formed. In some embodiments, the CMOS devices include control transistors/control logic coupled to terminals of the two-terminal memory device. In some embodiments, device 100 can be arranged in a column-based stack as illustrated in FIGS. 1A and 1B. Additionally or alternatively, device 100 can be arranged laterally, an example of which can be found at FIG. 6C.

Two-terminal memory cell 100 can include an active region 102 that can be situated between a first terminal 112 and second terminal 114 that comprise one or more electrical conductive metals. Active region 102 can be created comprising silicon bearing layer 104, interface layer 106, and active metal layer 110. Interface layer 106 can be composed of or comprise one or more engineered or controlled oxide(s), which is referred to herein as sub-oxide 108.

In some embodiments, the engineered or controlled sub-oxide 108 can have a thickness (e.g., $d_1$) that is within a range of about 2 nanometers to about 8 nanometers. In some embodiments, active region 102 can have a width (e.g., denoted $d_2$) that is in a range of about 20 nanometers to about 300 nanometers; in a range of about 2 nanometer to about 50 nanometers, or the like. In some embodiments, sub-oxide 108 can have a non-stoichiometric property such that exact proportions or exact arrangements are not necessary or are of less importance than certain operational characteristics that might be obtained via many different proportions or arrangements.

Diagram 120 of FIG. 1B depicts an example interface layer 106 for device 100 in more detail. For instance, interface layer 106 can include silicon layer 122, which can be a mixture of $SiO_2$, SiO, Si with an aggregate composition of, e.g., $SiO_x$, or in embodiments with germanium, $Si_xGe_yO_z$. Silicon layer 122 can be formed from silicon bearing layer 104 or from some other extant layer or film, possibly in combination with an amorphous silicon film. Silicon (Si) in silicon bearing layer 122 can oxidize when an associated surface is exposed to oxygen. Thus, depending on the technique for creating sub-oxide 108, silicon monoxide (SiO) can form that can be composed predominantly of SiO, which can grow or otherwise be created in response to an oxidation process. The SiO can undergo further oxidation to grow (or otherwise create) silicon dioxide ($SiO_2$) that can be predominantly composed of $SiO_2$.

In some embodiments, particularly those in connection with a metal reduction technique detailed herein, reduction metal layer 124 can also exist. It is understood that other layers, elements, or compounds can exist in a given interface layer 106 and/or other layers (not shown) might be present. Such can depend on the technique employed to create sub-oxide 108 or on desired characteristics (e.g., switching properties) of two-terminal memory device 100. It is also understood that although SiO is depicted as being situated atop Si, $SiO_2$ atop SiO, and so forth, such is merely an example, and need not be the case in all embodiments. Rather, in some embodiments a different arrangement can exist, which can be a function of the technique employed to create sub-oxide 108 and/or a characteristic desired for an associated device 100. It is appreciated that interface layer 106 can comprise a non-stoichiometric sub-oxide (e.g., sub-oxide 108) that can be a combination or mixture, possibly non-homogenous, of various silicon-based layers or elements with an aggregate chemical formula of $SiO_x$, where 0<X<2. As another example, the aggregate chemical formula can be $Si_xGe_yO_z$, where x≥0, y≥0, z≥0, x+y≤z≤2 (x+y). Other examples can exist.

Although described in more detail herein, it is here noted that in some embodiments, silicon bearing layer 104 can be comprised of a positive (p) type semiconductor material. In some embodiments, silicon bearing layer 104 can have a thickness in a range of about 20 nanometers to about 250 nanometers, in a range of about 2 nm to about 50 nm, or the like. In some embodiments, silicon bearing layer 104 can have a doping coefficient in a range of about 0.001 ohm-cm to about 10 ohm-cm. In some embodiments, active metal layer 110 can comprise silver.

Figure 2:
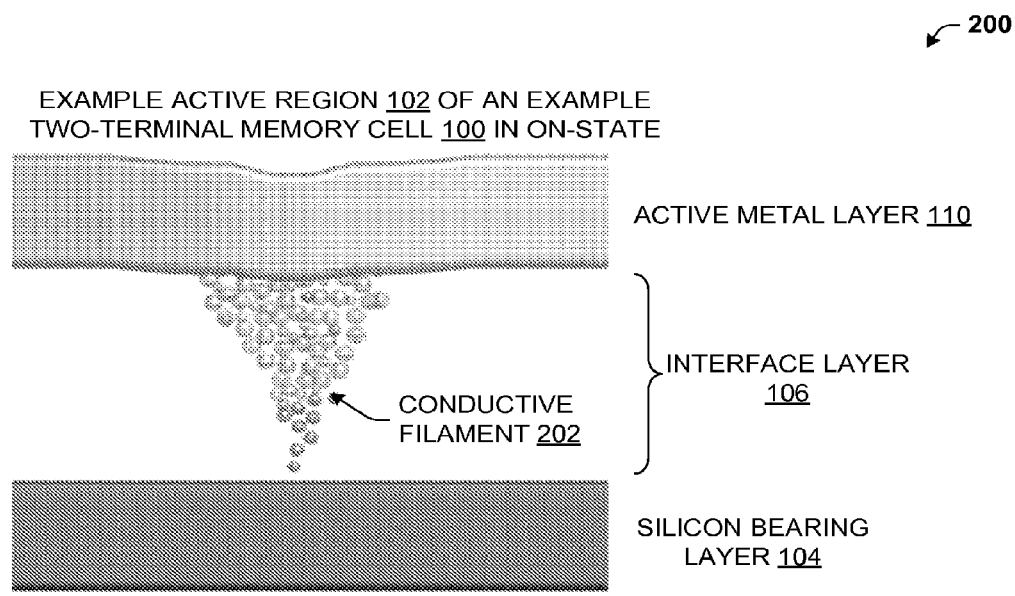
FIG. 2 depicts an example illustration of a cross-section of an example active region of an example two-terminal memory cell in accordance with certain embodiments of this disclosure.

While still referring to FIG. 1, but turning also now to FIG. 2, illustration 200 is provided. Illustration 200 depicts a cross-section of an example active region 102 of an example two-terminal memory cell 100. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cells or devices), as utilized herein, comprise circuit components having two electrical contacts (also referred to herein as electrodes or terminals) with an active region (e.g., active region 102) between the two conductive contacts (e.g., terminals 112, 114).

An example of the active region 102 of the two-terminal memory device 100 is provided by illustration 200. This active region 102 can exhibit a plurality of stable or semi-stable resistive states, each resistive state having different electrical characteristics (e.g., resistance). Moreover, respective states of the plurality of states can be formed or activated in response to a respective voltage difference applied at the two conductive contacts. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, conductive filament 202 can form when ions from active metal layer 110 permeate interface layer 106, generally in response to a program voltage applied across the terminals 112, 114, which is further detailed infra. One example of a filamentary-based memory cell can comprise: a p-type (positive) or n-type (negative) silicon bearing layer 104; the interface layer 106 (also referred to as a resistive switching layer or a resistive switching material layer), which in this case can comprise sub-oxide 108, and active metal layer 110 for providing filament forming ions to the interface layer 106. The p-type or n-type silicon bearing layer 104 can include a p-type or n-type polysilicon, p-type or n-type SiGe, or the like. The interface layer 106 can comprise, e.g., an undoped amorphous silicon layer or mixture, a doped polysilicon layer or mixture, a doped silicon germanium layer or mixture, a semiconductor layer or mixture having intrinsic characteristics, a silicon sub-oxide layer or mixture, and so forth.

Examples of the active metal layer 110 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer 110 in some aspects. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

Generally, to program one or more memory cell, a suitable program voltage can be applied across the memory cell causing a conductive filament to form through a resistive portion (e.g., interface layer) of the memory cell as mentioned above. This can further cause the memory cell to switch from a relatively high resistive state, to a relatively low resistive state. An erase process can be implemented to reverse the foregoing, at least in part, causing the memory cell to return to the high resistive state from the low resistive state. This physical change of state, in the context of memory, can be associated with respective logical states of a binary bit. Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

As applied to illustration 200, when a suitable program voltage (e.g., a positive voltage) is applied across the terminals of two-terminal memory cell 100, ions from active metal layer 110 move into the adjacent interface layer 106, which is at least partially permeable to the ions that collectively form conductive filament 202. Conductive filament 202 can span the entire thickness or a portion of the interface layer 106, facilitating increased electrical conductivity through the interface layer 106, which otherwise has a high electrical resistance.

When the program voltage is applied and conductive filament 202 forms, the memory cell is said to be in the on-state, which is a low-resistance state. In response to a suitable erase voltage (e.g., a negative voltage), conductive filament 202 can at least in part deform or retract, breaking the electrical conductive path. Such is a high-resistance state, associated with an off-state. The state can be determined by measuring current through cell 100 when a suitable read voltage is applied. The read voltage generally is not sufficient (or the proper polarity) to either form or disperse conductive filament 202, so current readings associated with the read current can be used to determine if the cell is in the high-resistance state (e.g., off) or the low-resistance state (e.g., on). In this example, two-terminal memory cell 100 is in the on state, with conductive filament spanning a significant portion of interface layer 106.

Figure 3A:
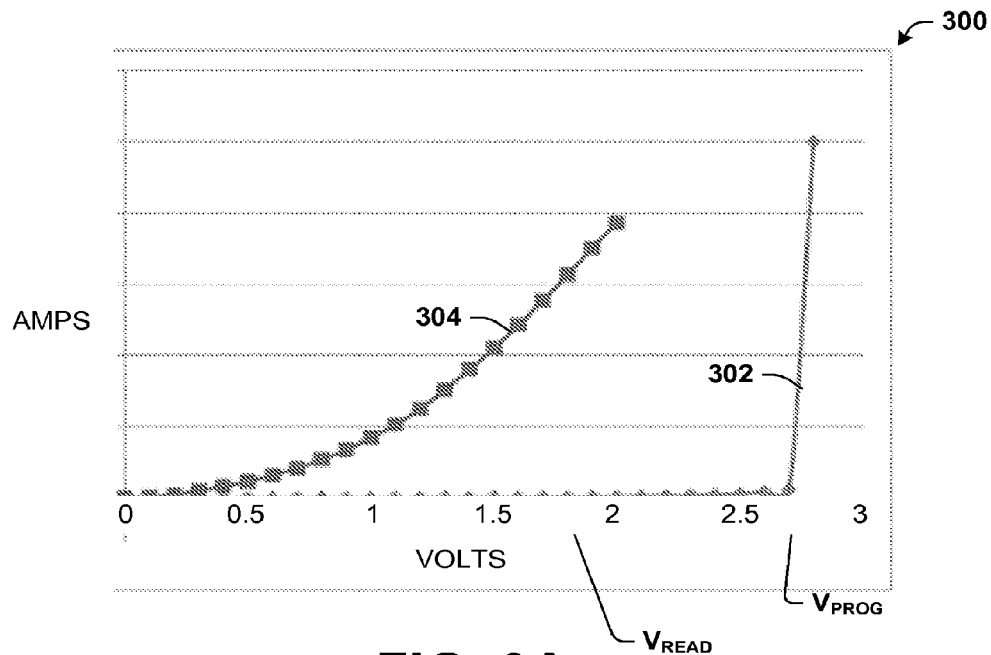
FIG. 3A illustrates an example graph that depict current over voltage characteristics for an example two-terminal memory device that switches states in response to a program voltage in accordance with certain embodiments of this disclosure.
Figure 3B:
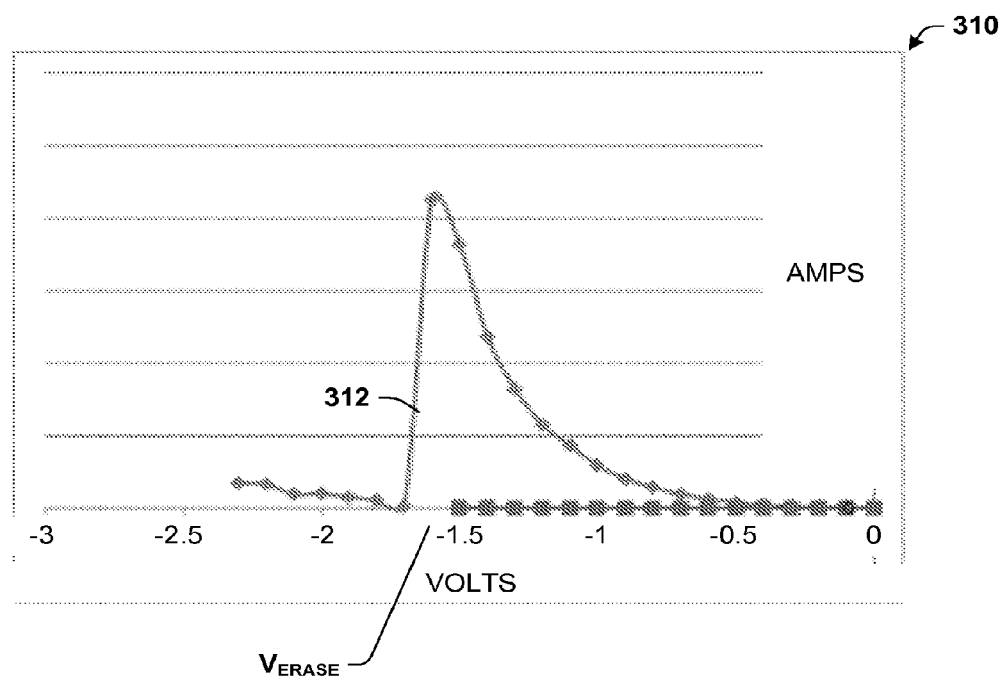
FIG. 3B illustrates an example graph that depict current over voltage characteristics for an example two-terminal memory device that switches states in response to an erase voltage in accordance with certain embodiments of this disclosure.

FIGS. 3A and 3B are intended to be examined in conjunction with FIG. 2 and depict example graphs 300 and 310 that depict current over voltage characteristics for an example cell 100 that switches states in response to a program voltage (e.g., graph 300) and an erase voltage (e.g., graph 310). Graph 300 primarily illustrates a switch from a relatively high resistance state (e.g., an off state) to a relatively low resistance state (e.g., an on state) in response to a program voltage, which is depicted by plot 302. In this example, the program voltage, $V_{prog}$, is between 2.5 V and 3 V. Therefore, when $V_{prog}$ is applied to terminal 114 (or $V_{terminal\ 114} - V_{terminal\ 112} \geq V_{prog}$) and cell 100 is in an off state, which is a relatively high resistance state in which conductive filament 202 is not formed, then cell 100 can switch to an on state, which is a relatively low resistance state due to formation of conductive filament 202. As plot 302 illustrates, current measured through cell 100 can be at or near zero until the switch the on state occurs, at which point current through cell 100 induced by a given voltage can increase many orders of magnitude versus a current measured when in the off state.

As a result of such switching characteristics, a read voltage, $V_{read}$, can be applied at any time, for instance about 1 or 2 volts or substantially any value that does not equal or go beyond $V_{prog}$. Measured current through cell 100 in response to $V_{read}$ can be indicative of a current state for cell 100, and this state (e.g., off/on) can map to a logical zero or one of a binary bit. For example, if cell 100 is in an off state (e.g., relatively high resistance state in which conductive filament 202 is not formed), then current readings associated with $V_{read}$ can measure very close to zero, as indicated by plot 302. On the other hand, if cell 100 is in an on state (e.g., relatively low resistance state in which conductive filament 202 is formed), then current readings associated with $V_{read}$ can differ significantly, as illustrated by plot 304.

Graph 310 primarily illustrates a switch from a relatively low resistance state (e.g., an on state) to a relatively high resistance state (e.g., an off state) in response to an erase voltage, $V_{erase}$. In this example, $V_{erase}$ can be about −1.5 volts. Thus, when $V_{erase}$ is applied to terminal 112 (or $V_{terminal\ 112} - V_{terminal\ 114} \leq V_{erase}$) and cell 100 is in an on state, which is a relatively low resistance state in which conductive filament 202 is formed, then cell 100 can switch to an off state, which is a relatively high resistance state that exists in absence of conductive filament 202. Such is illustrated by plot 312.

Still referring to FIGS. 1A-3B, in some embodiments, active region 102 can have a relatively low resistance within a range of about 10 kilo-ohms to about 5 mega-ohms in response to memory cell 100 being in an on state. Active region 102 can have a relatively high resistance within a range of about 5 mega-ohms to about 100 mega-ohms in response to memory cell 100 being in an off state. In some embodiments, memory cell 100 can switch from the off state to the on state in response to a program voltage, $V_{prog}$, in a range of about 2 volts to about 6 volts. The memory cell can switch from the on state to the off state in response to an erase voltage, $V_{erase}$, which can be in a range from about −1.5 volts to about −6 volts. A read voltage, $V_{read}$, which can be either polarity and, can have a magnitude that is in a range bounded by $V_{erase}$ and $V_{prog}$, and thus not significant enough to either create or disperse conductive filament 202, can be employed to determine a current state for cell 100 based on a measured current through cell 100 in response to $V_{read}$.

It should be appreciated that a variety of resistive switching memory cell technologies exist, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage or vice versa. Where an embodiment does not specify a unipolar or bipolar characteristic, or does not indicate suitable program/erase voltages, it is intended that such aspects and embodiments incorporate any suitable memory cell technology and can be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Compatibility with complementary metal oxide semiconductor (CMOS) fabrication processes is believed by the inventors of the present disclosure to be a significant factor related to fabrication cost reduction for new types of electronic memory. Some proposed resistive-switching memory cells are constrained by CMOS fabrication constraints, including process temperature(s), memory cell material(s), wiring or electrode material(s), memory cell material(s), dopant material(s), and so forth. For example, to avoid overhead costs in retooling CMOS fabrication equipment, embodiments of the resistive-switching memory can often involve memory elements built on a Si wafer. Interconnecting the Si wafer and the memory elements can involve several layers of interconnects, often involving metals such as Aluminum (Al) or Copper (Cu). Due to relatively low softening temperatures of these metals, fabrication of the memory elements can be constrained to 450 degrees Celsius or lower (e.g., for Al interconnect technology).

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, etc.) are projected in association with producing these devices. In addition, these devices can exhibit relatively slow switching speeds, small on/off resistance ratios (e.g., leading to small sensing margin) or poor thermal stability, as well as other problems. Accordingly, many techniques disclosed herein, e.g., with reference to FIG. 5, can accommodate creation of sub-oxide 108 on a CMOS substrate. For example, techniques disclosed herein can be below suitable temperature budgets associated with CMOS substrates and can in some embodiments be readily integrated into existing CMOS fabrication processes, such as, e.g., a post etch cleaning process or the like.

Figure 4:
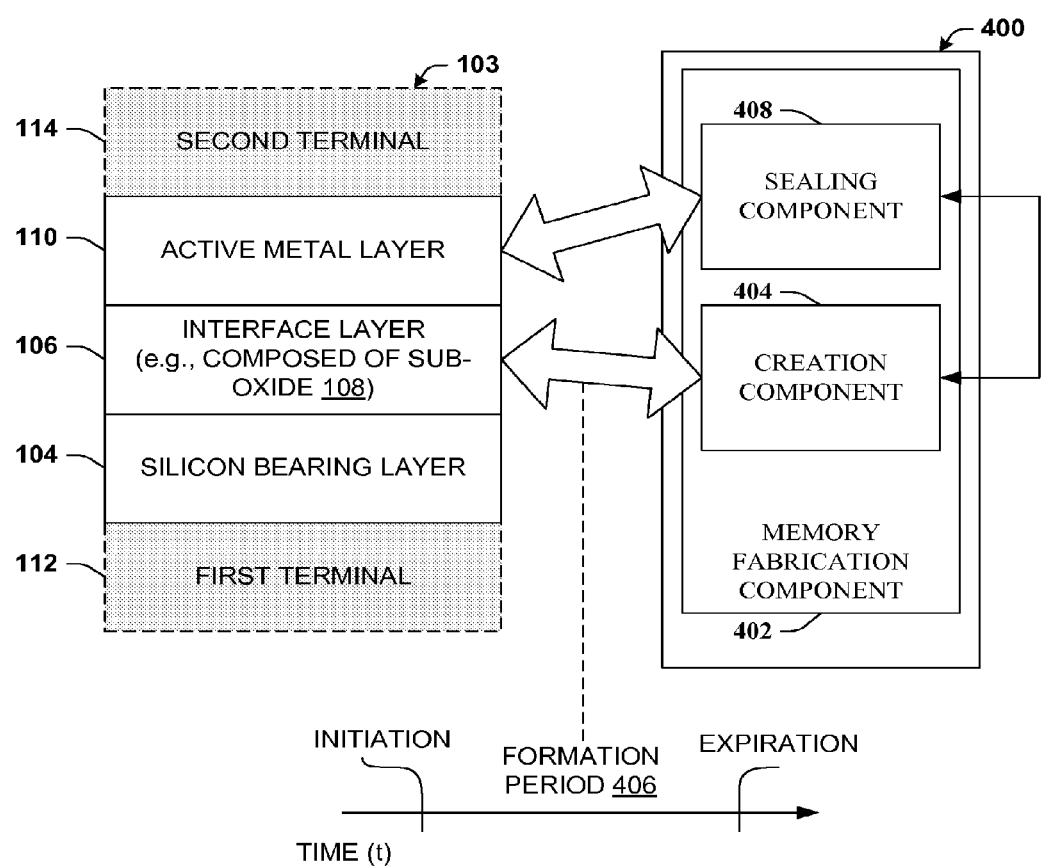
FIG. 4 illustrates a block diagram of an example system that can construct a two-terminal memory device with a silicon sub-oxide comprising an interface layer of the two-terminal memory device during a formation period in accordance with certain embodiments of this disclosure.

Turning now to FIG. 4, system 400 is depicted. System 400 can construct a two-terminal memory device (e.g., device 100) with a silicon sub-oxide (e.g., sub-oxide 108 that can include Silicon, Oxygen, and optionally Germanium) comprising an interface layer (e.g., interface layer 106) of the two-terminal memory device. In various embodiments system 400 may include a variety of stand-alone semiconductor fabrication machines, including steppers, deposition chambers, etching chambers, sputtering chambers, and the like. In various embodiments, system 400 may include a number of different fabrication devices from different vendors, which may or may not directly interface with each other.

In various embodiments, system 400 can employ one or more techniques detailed herein in connection with creating sub-oxide 108 and/or interface layer 106. System 400 can include a memory that stores computer executable components and a processor that executes computer executable components stored in the memory, examples of which can be found with reference to FIG. 10. It is to be appreciated that the computer 1002 can be used in connection with implementing one or more of the systems or components shown and described in connection with FIG. 4 or other figures disclosed herein. As depicted, system 400 can include a memory fabrication component 402 that can include a creation component 404 and a sealing component 408.

Memory fabrication component 402 can be configured to facilitate fabrication of two-terminal memory cell 100 with active region 102. Active region 102 can include silicon bearing layer 104, interface layer 106 comprising a non-stoichiometric sub-oxide 108 situated atop silicon bearing layer 104, and active metal layer 110 situated atop interface layer 106.

Creation component 404 can be configured to facilitate creation of interface layer 106 during a formation period 406. Interface layer 106 can be less than or equal to about 8 nanometers in thickness. Creation component 404 can employ many different techniques for creating interface layer 106 and/or an associated silicon sub-oxide 108, many of which are described in connection with FIG. 5. For example, creation component 404 can facilitate growth of sub-oxide 108, deposition of sub-oxide 108 or a film that grows or otherwise create sub-oxide 108, transformation of an extant film into sub-oxide 108, etc. Given the many techniques disclosed herein, formation period 406 can vary as a function of the technique utilized or operating characteristics desired, but will typically have a discrete initiation time at which formation period 406 begins and an expiration time at which formation period 406 ends. In some embodiments, initiation of formation period 406 can occur after a cleaning process and expiration of formation period 406 can occur when active metal layer 110 is deposited, after which changes to interface layer 106 become less feasible and/or the state of interface layer 106 is substantially suspended as-is.

As such, sealing component 408 can be configured to deposit active metal layer 110 in response to expiration of formation period 406. In some embodiments, silver or another metal or compound comprising active metal layer 110 can be deposited according to a subtractive/reduction process (e.g., deposited by either evaporation, sputter, or electroplating), a patterning process, an etching process, or by a Damascene process. In some embodiments, active metal layer 110 can have a thickness in a range of about 10 nanometers to about 100 nanometers. Hence, an aggregate thickness of active region 102 can be in a range of about 20 nanometers to about 300 nanometers.

With reference now to FIG. 5, system 500 is illustrated. System 500 provides numerous example sub-oxide 108 creation techniques. For example, reference numeral 502 illustrates a first example technique employed by creation component 404 to facilitate creation of interface layer 106 can relate to growing sub-oxide 108 on silicon bearing layer 104. In some embodiments, sub-oxide 108 can be grown according to the first example technique in ambient air at a relatively low temperature of about 20 C to about 100 C with a formation period 406 that last up to about 24 hours. In some embodiments, the first example technique can include a hydrogen fluoride (HF) treatment, a chemical-mechanical planarization (CMP) treatment, or a sputter etch treatment with argon prior to expiration of formation period 406.

In some embodiments, creation component 404 can facilitate creation of interface layer 106 by way of a second example technique, which is illustrated by reference numeral 504. The second technique can comprise a chemical wet treatment that exposes silicon bearing layer 104 or an extant film included in interface layer 106 to a chemical wet oxidizing source. In some embodiments, the oxidizing source can be one of or a suitable combination of: nitric acid ($HNO_3$), hydrogen peroxide ($H_2O_2$), ozone ($O_3$), water, ($H_2O$), dilute HF, sulfuric acid ($H_2SO_4$), ammonium hydroxide (NH$_4$OH), or hydrochloric acid (HCl). The chemical wet treatment can occur in a temperature range of between about 20 C to about 80 C and can be applied for up to about 15 minutes.

In accordance with a third example technique, depicted by reference numeral 506, creation component 404 can facilitate creation of interface layer 106 by way of a plasma treatment. The plasma treatment can be applied to silicon bearing layer 104 or an extant film included in interface layer 106. In some embodiments, formation period 406 can extend from about 1 minute to about 5 minutes at a temperature of up to about 250 C. The plasma treatment can include one of or a combination of oxygen, hydrogen, nitrous oxide, or other suitable elements in a plasma state.

Creation component 404 can facilitate creation of interface layer 106 by way of a fourth example technique described by reference numeral 508. For example, creation component 404 can insert or otherwise include a metal layer (e.g., reduction metal layer 128) in a film included in interface layer 106. The film in which the metal layer is included can be an extant silicon oxide film or sub-oxide 108 created according to a different technique and augmented with the metal layer. The metal layer can have a thickness that is less than about four nanometers and can comprise one or more of a compound of aluminum, tungsten, nickel, titanium, copper, cobalt, molybdenum or another metal that bonds with silicon oxide and, e.g., due to a higher energy, reduces an amount of oxygen in the oxide during a bonding process.

According to a fifth example technique detailed in connection with reference numeral 510, creation component 404 can facilitate creation of interface layer 106 by way of a silicon deposition process. Creation component 404 can deposit silicon or a derivative of silicon on an extant film or sub-oxide 108 constructed according to another technique, or on silicon bearing layer 104. These deposits, which can include silicon can, when exposed to an ambient environment that include oxygen, undergo an oxidation process that can yield sub-oxide 108. In some embodiments, the deposits can be patterned according to a defined arrangement. The ambient environment that includes oxygen can be in a temperature range of about 100 C to about 500 C and formation period 406 can be up to one hour.

Creation component 404 can facilitate creation of sub-oxide 108 in connection with a sixth technique denoted at reference numeral 512. For instance, the sixth technique can comprise high dose oxygen implantation in an extant film included in interface layer 106. The extant film can include silicon or a derivative of silicon and can be sub-oxide 108 that is in an intermediate stage created by way of a different technique. The high dose oxygen implantation can have a dose coefficient of up to about 1E16 cm$^2$ at an energy of up to about 500 kilo-electron-volts. In some embodiments, the beam current density can be up to about 0.2 mA/cm$^2$. The temperature can be up to about 200 C.

In some embodiments, creation component 404 can facilitate creation of interface layer 106 by way of a seventh example technique described in connection with reference numeral 514. The seventh example technique can comprise an ion bombardment process that can bombard a silicon dioxide (SiO$_2$) film included in interface layer 106 with certain ions. These ions can be produced from one of or a combination of, e.g., argon, neon, krypton, xenon, silicon, germanium, or the like. In some embodiments, an energy associated with the ion bombardment can be up to about 2 kilo-electron-volts. In some embodiments, a dose coefficient associated with the ion bombardment can be up to about 1E16 cm$^2$. The beam current density can be up to about 0.2 mA/cm$^2$. The temperature can be up to about 200 C.

It is appreciated that all or a portion of the techniques employed by creation component 404 to create interface layer 106 comprising sub-oxide 108 can include a cleaning process prior to initiation of formation period 406. Such a cleaning process can remove extant oxides from silicon bearing layer 104 or from an extant film included in interface layer 106 that is in an intermediate state and/or provides a medium out of which to create sub-oxide 108. Furthermore, all or portions of the techniques employed by creation component 404 to create interface layer 106 comprising sub-oxide 108 can include one or more processes relating to patterning or etching, certain examples of which are provided with reference to FIGS. 6A and 6B. Such can occur following termination of formation period 406 or, in some embodiments, during formation period 406.

Figure 6A:
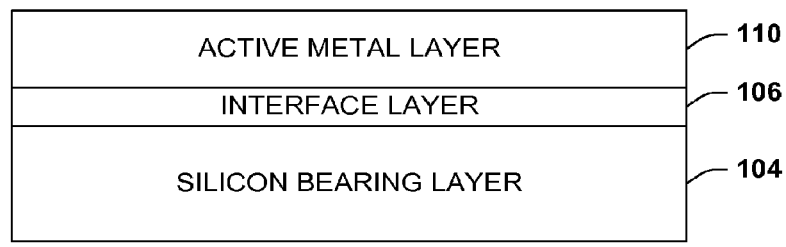
FIG. 6A depicts an example formation of the interface layer in connection with a deposit metal/etch scheme in accordance with certain embodiments of this disclosure.
Figure 6B:
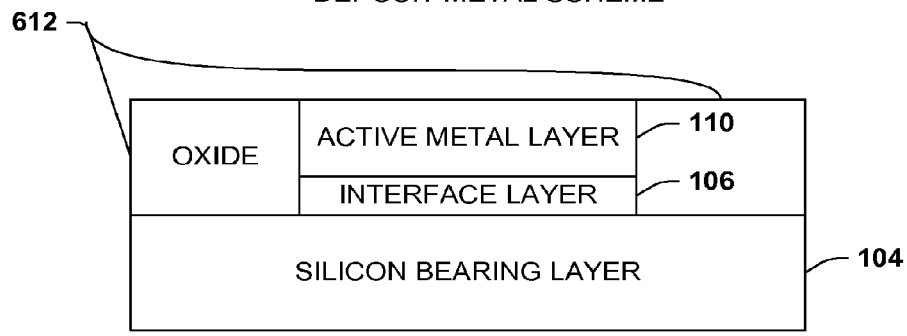
FIG. 6B depicts an example formation of the interface layer in connection with an etch/deposit metal scheme in accordance with certain embodiments of this disclosure.

FIGS. 6A and 6B relate to two different example fabrication techniques. Turning now to FIG. 6A, example 600 is provided. Example 600 relates to formation of interface layer in connection with a deposit metal/etch scheme. In contrast, example 610 of FIG. 6B relates to formation of interface layer 106 in connection with an etch/deposit metal scheme. In the latter example (e.g., example 610), oxide 612 has been etched to produce a central aperture in which interface layer 106 can be grown or otherwise formed and active metal layer 110 deposited.

Figure 6C:
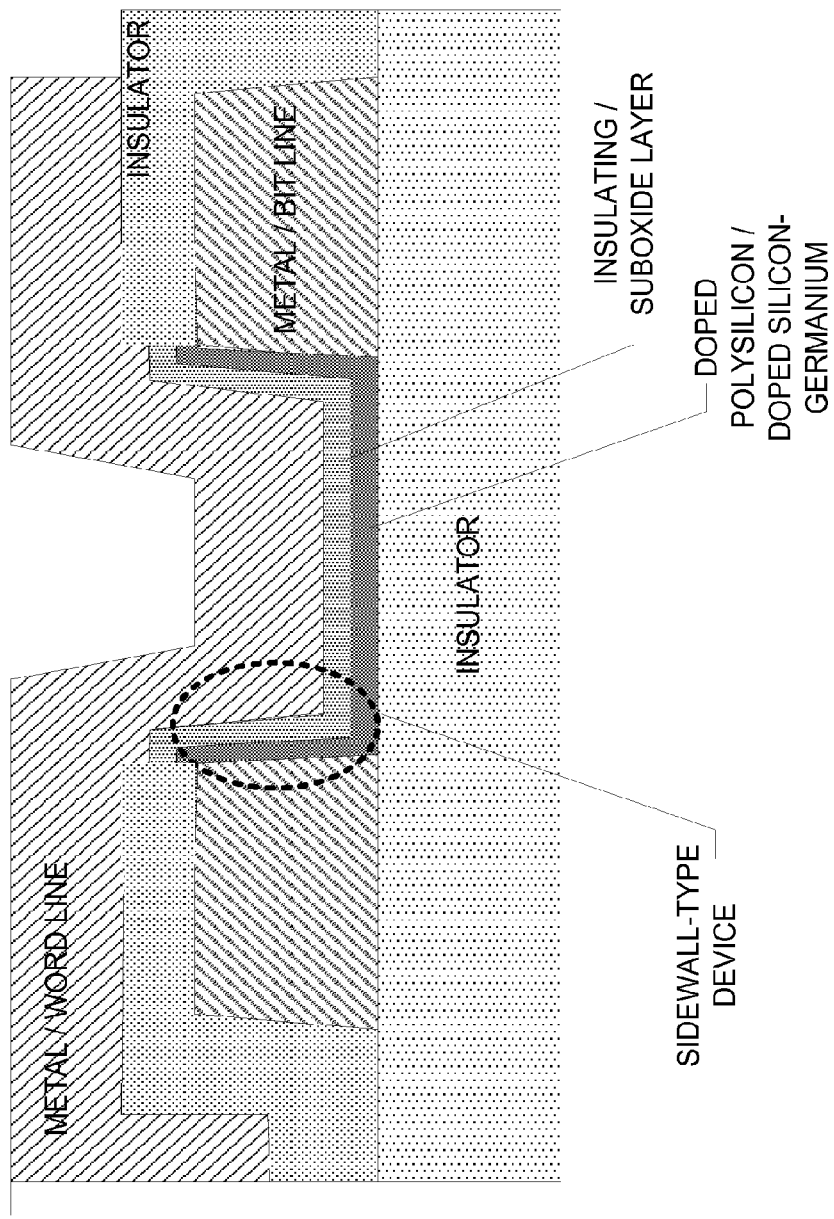
FIG. 6C illustrates an example memory device formed along a direction having an oblique or perpendicular angle to a substrate surface in an embodiment(s).

FIG. 6C illustrates an example sidewall-type memory device, that can relate to the disclosed subject matter. For example, memory device 100 or portions thereof can be situated sideways or laterally in a sidewall arrangement. Such a sidewall-type device can include doped polysilicon and/or doped silicon-germanium adjacent to and in physical contact with a sub-oxide layer (e.g., sub-oxide 108) and/or an interface layer (e.g., interface layer (106).

Example Methods for Creating a Silicon Sub-Oxide for Two-Terminal Memory

The aforementioned diagrams have been described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 7:
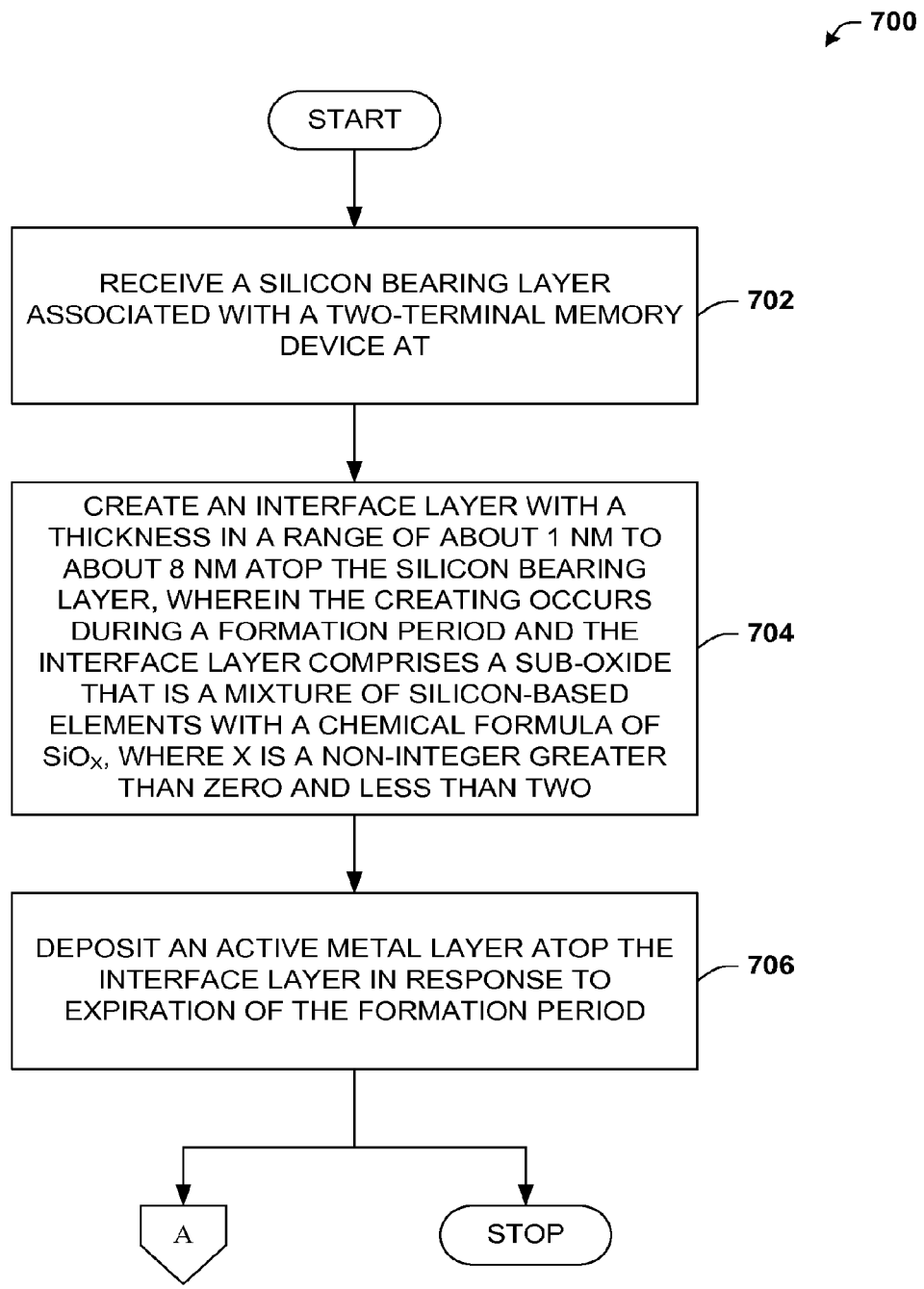
FIG. 7 illustrates an example methodology that can provide for creating a silicon sub-oxide that comprises an interface layer of a two-terminal memory device in accordance with certain embodiments of this disclosure.
Figure 8:
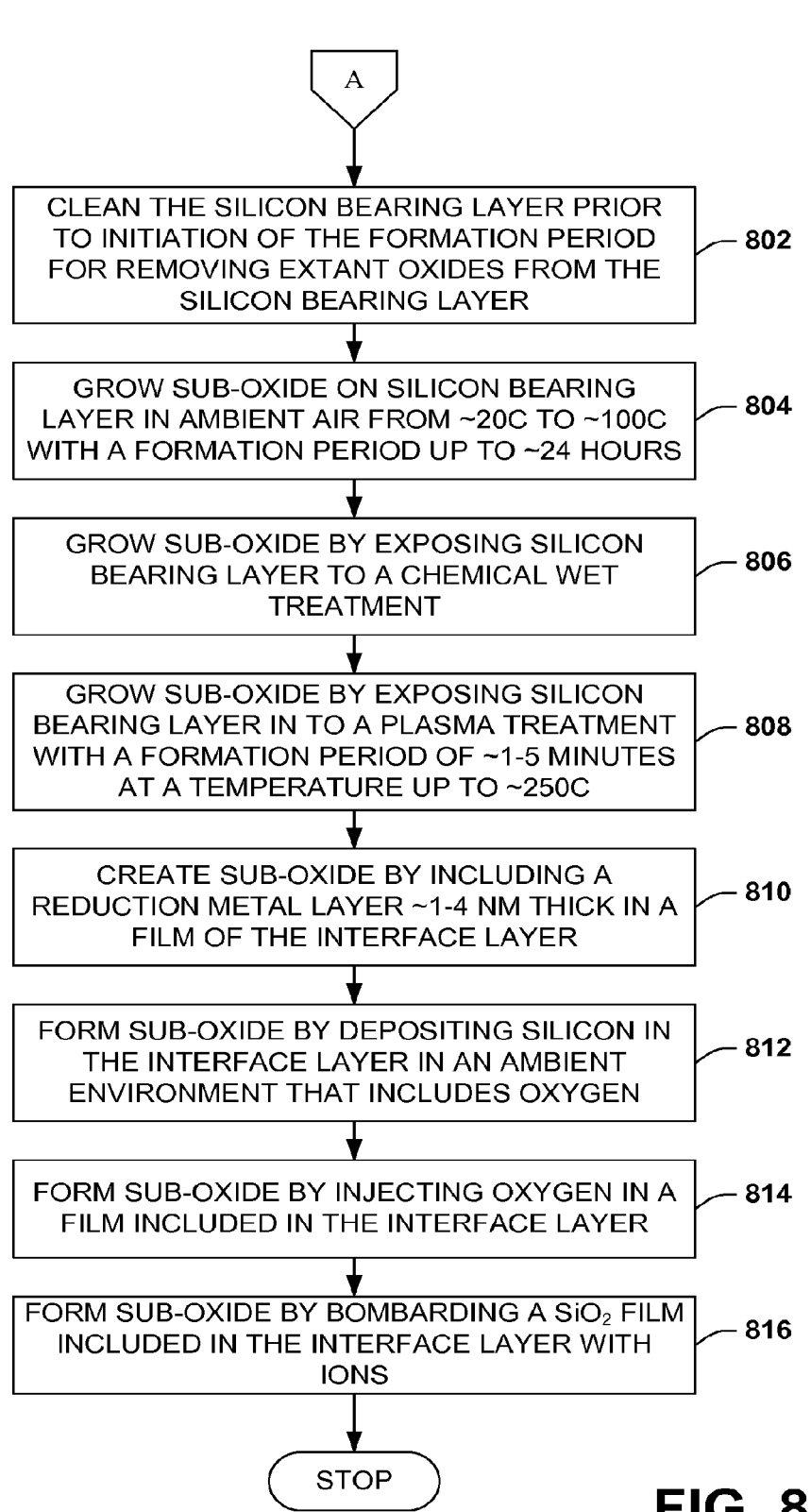
FIG. 8 illustrates an example methodology that can provide for numerous techniques in connection with creating the interface layer comprising the sub-oxide in accordance with certain embodiments of this disclosure.

In view of the exemplary diagrams described supra, process methods that can be implemented in accordance with the disclosed subject matter will be better appreciated with reference to the flow chart of FIGS. 7 and 8. While for purposes of simplicity of explanation, the method of FIGS. 7 and 8 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 7 illustrates exemplary method 700. Method 700 can provide for forming or creating a silicon sub-oxide that comprises an interface layer of a two-terminal memory device. For example, at reference numeral 702, a silicon bearing layer associated with a two-terminal memory device can be received or formed. In some embodiments, the silicon bearing layer can be adjacent to and in physical contact with a first terminal of the two-terminal memory device, wherein the first terminal comprises a conductive metal layer. In some embodiments, the silicon bearing layer can exist atop or adjacent to a CMOS substrate, in which case a creation process that occurs at relatively high temperatures (e.g., above about 300 C to about 470 C) can damage or ruin elements of the CMOS substrate. In other embodiments, no significant temperature threshold need be observed. In some embodiments, certain temporal constraints can exist relating to timing associated with the creation of the sub-oxide, while in other embodiments, no significant temporal constraints exist.

At reference numeral 704, an interface layer with a thickness in a range of about one nanometer to about eight nanometers can be formed or created atop or adjacent to the silicon bearing layer. The creating at reference numeral 704 can occur during a defined formation period and the interface layer can comprise a sub-oxide that is a mixture of silicon-based elements or compounds with a chemical formula of $SiO_x$, where X is a non-integer greater than zero and less than two.

At reference numeral 706, an active metal layer can be deposited atop or adjacent to the sub-oxide in response to expiration of the formation period. The active metal layer can be deposited according to a subtractive/reduction process (e.g., deposited by either evaporation, sputter, or electroplating), a patterning process, an etching process, or by a Damascene process. In some embodiments, active metal layer 110 can have a thickness in a range of about 10 nanometers to about 100 nanometers.

With reference now to FIG. 8, example method 800 is depicted. Method 800 can provide for numerous techniques in connection with creating the interface layer comprising a sub-oxide. For instance, at reference numeral 802, the silicon bearing layer or an extant film included in the interface layer can be cleaned prior to the facilitating creation of the sub-oxide that can occur in connection with reference numeral 704 of FIG. 7. Cleaning the silicon bearing layer or extant film can include removing certain oxides, contaminants, or other undesired elements that exist on the silicon bearing layer or extant film prior to the cleaning. Completion of the cleaning can coincide with initiation of the formation period.

Reference numerals 804-816 relate to numerous example techniques by which the interface layer can be created includes the sub-oxide. These example techniques are intended to be exemplary in nature and are typically alternatives, but are not construed to be limiting, as other techniques or combinations of techniques can exist. The techniques by which the sub-oxide can be created can relate to creation by growth, by deposition, by a transformation, or another process. In some cases, two or more techniques can be combined and/or employed in combination. Selection of a particular technique over others can be based on target operating characteristics for the two-terminal memory device and/or based on existing facilities, equipment, or other factors.

At reference numeral 804, the sub-oxide can be grown on the silicon bearing layer in ambient air from about 20 C to about 100 C. The formation period can be up to about 24 hours. In some embodiments, a hydrogen fluoride (HF) treatment, a chemical-mechanical planarization (CMP) treatment, or a sputter etch treatment with argon can be applied prior to expiration of the formation period At reference numeral 806, the sub-oxide can be grown by exposing the silicon bearing layer or an extant film included in the interface layer to a chemical wet treatment. The chemical wet treatment can expose the silicon bearing layer or an extant film included in the interface layer to an oxidizing source. In some embodiments, the oxidizing source can be one of or a mixture of nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl).

At reference numeral 808, the sub-oxide can be grown by exposing the silicon bearing layer or an extant film included in the interface layer to a plasma treatment. The plasma treatment can last for about one minute to about five minutes and can be applied at a temperature of up to about 250 C. The plasma employed for the plasma treatment can comprise oxygen and/or hydrogen in a plasma state.

At reference numeral 810, the sub-oxide can be created by including a reduction metal layer in a range of about one nanometer to about four nanometers in thickness in an extant film included in the interface layer. In some embodiments, the reduction metal layer can comprise one of or a compound of aluminum, tungsten, nickel, titanium, copper, cobalt, molybdenum or another metal that bonds with an oxide of the extant film and reduces an amount of oxygen included in the oxide of the film. For example, applying a reduction metal layer to a layer of $SiO_2$ can form a sub-oxide with the reduction metal layer, a SiO layer and a $SiO_2$ layer.

At reference numeral 812, the sub-oxide can be formed by depositing silicon in the interface layer in an ambient environment that includes oxygen. These deposits of silicon can bond with oxygen included in the ambient environment to form the sub-oxide. The ambient environment can be at a temperature in a range of about 100 C to about 500 C and the formation period can be up to about one hour.

At reference numeral 814, the sub-oxide can be formed by injecting oxygen in a film included in the interface layer. For example, high dose oxygen implantation can employed that can facilitate oxidation in lower layers of the interface layer. The high does oxygen implantation can have a dose coefficient up to about $1E16$ $cm^2$ at an energy of up to about 500 kilo-electron-volts.

At reference numeral 816, the sub-oxide can be formed by bombarding a $SiO_2$ film included in the interface layer with ions. In some embodiments, the ion bombardment can have an energy of up to about 2 kilo-electron-volts and a dose coefficient up to about $1E16$ $cm^2$. In some embodiments, the ions can be supplied from a source that includes one of or a mixture of argon, neon, krypton, xenon, silicon, or germanium.

What has been described herein can be implemented various systems or apparatuses. For example, such a system or apparatus, in some embodiments can comprise a memory fabrication component that facilitates fabrication of a two-terminal memory cell with an active region comprising a silicon bearing layer, an interface layer comprising a non-stoichiometric sub-oxide situated atop the silicon bearing layer, and an active metal layer situated atop the interface layer. The memory fabrication component can comprise a creation/formation component that facilitates creation of the interface layer during a formation period, wherein the interface layer has a thickness that is less than about 8 nanometers. The memory fabrication component can further comprise a sealing component that deposits the active metal layer in response to expiration of the formation period.

In some embodiments, the sub-oxide comprises a mixture of silicon (Si), silicon dioxide ($SiO_2$), and silicon monoxide (SiO) and is represented as $SiO_x$, where $0<X<2$.

In some embodiments, the silicon bearing layer is a positive (p) type semiconductor with a thickness in a range of about 20 nanometers to about 250 nanometers and with a doping coefficient in a range of about 0.001 ohm-cm to about 10 ohm-cm.

In some embodiments, the active region has a relatively low resistance within a range of about 10 kilo-ohms to about 5 mega-ohms in response to the memory cell being in an on state; and a relatively high resistance within a range of about 5 mega-ohms to about 100 mega-ohms in response to the memory cell being in an off state.

In some embodiments, the two-terminal memory cell switches from the off state to the on state in response to a program voltage in a range of about 2 volts to about 6 volts and the memory cell switches from the on state to the off state in response to an erase voltage in a range of about −1.5 volts to about −6 volts.

In some embodiments, the creation component facilitates cleaning of the silicon bearing layer prior to initiation of the formation period, wherein the cleaning comprises removal of oxide from the silicon bearing layer.

In some embodiments, the creation component facilitates creation of the interface layer by way of a first technique that comprises growing the sub-oxide on the silicon bearing layer in ambient air that is in a range of about 20 degrees Celsius (C) to about 100 degrees C., wherein the formation period extends up to about 24 hours.

In some embodiments, the first technique includes a hydrogen fluoride (HF) treatment, a chemical-mechanical planarization (CMP) treatment, or a sputter etch treatment with argon prior to expiration of the formation period.

In some embodiments, the creation component facilitates creation of the interface layer by way of a second technique that comprises a chemical wet treatment that exposes the silicon bearing layer to an oxidizing source.

In some embodiments, the oxidizing source is at least one of nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl).

In some embodiments, the creation component facilitates creation of the interface layer by way of a third technique that comprises a plasma treatment applied to the silicon bearing layer, wherein the formation period extends from about 1 minute to about 5 minutes at a temperature of up to about 250 degrees C.

In some embodiments, the plasma treatment includes at least one of oxygen ($O_2$) or hydrogen ($H_2$) in a plasma state.

In some embodiments, the creation component facilitates creation of the interface layer by way of a fourth technique that comprises including a metal layer in film included in the interface layer, wherein a thickness for the metal layer is less than about 4 nanometers.

In some embodiments, the metal layer comprises at least one of or a compound of aluminum, tungsten, nickel, titanium, copper, cobalt, molybdenum or another metal that bonds with an oxide of the film and reduces an amount of oxygen included in the oxide.

In some embodiments, the creation component facilitates creation of the interface layer by way of a fifth technique that comprises a deposition of silicon in the interface layer in an ambient environment that includes oxygen.

In some embodiments, the ambient environment is at a temperature in a range of about 100 degrees C. to about 500 degrees C. and the formation period is up to about one hour.

In some embodiments, the creation component facilitates creation of the interface layer by way of a sixth technique that comprises high dose oxygen implantation in a film included in the interface.

In some embodiments, the high dose oxygen implantation has a dose coefficient up to about $1E16$ $cm^2$ at an energy of up to about 500 kilo-electron-volts.

In some embodiments, the creation component facilitates creation of the interface layer by way of a seventh technique that comprises ion bombardment of a silicon dioxide ($SiO_2$) film included in the interface layer.

In some embodiments, the ion bombardment comprises at least one of argon, neon, krypton, xenon, silicon, or germanium with an energy of up to about 2 kilo-electron-volts and a dose coefficient up to about $1E16$ $cm^2$.

In some embodiments, the active region has a thickness and width in a range of about 20 nanometers to about 300 nanometers.

Example Operating Environments

Figure 9:
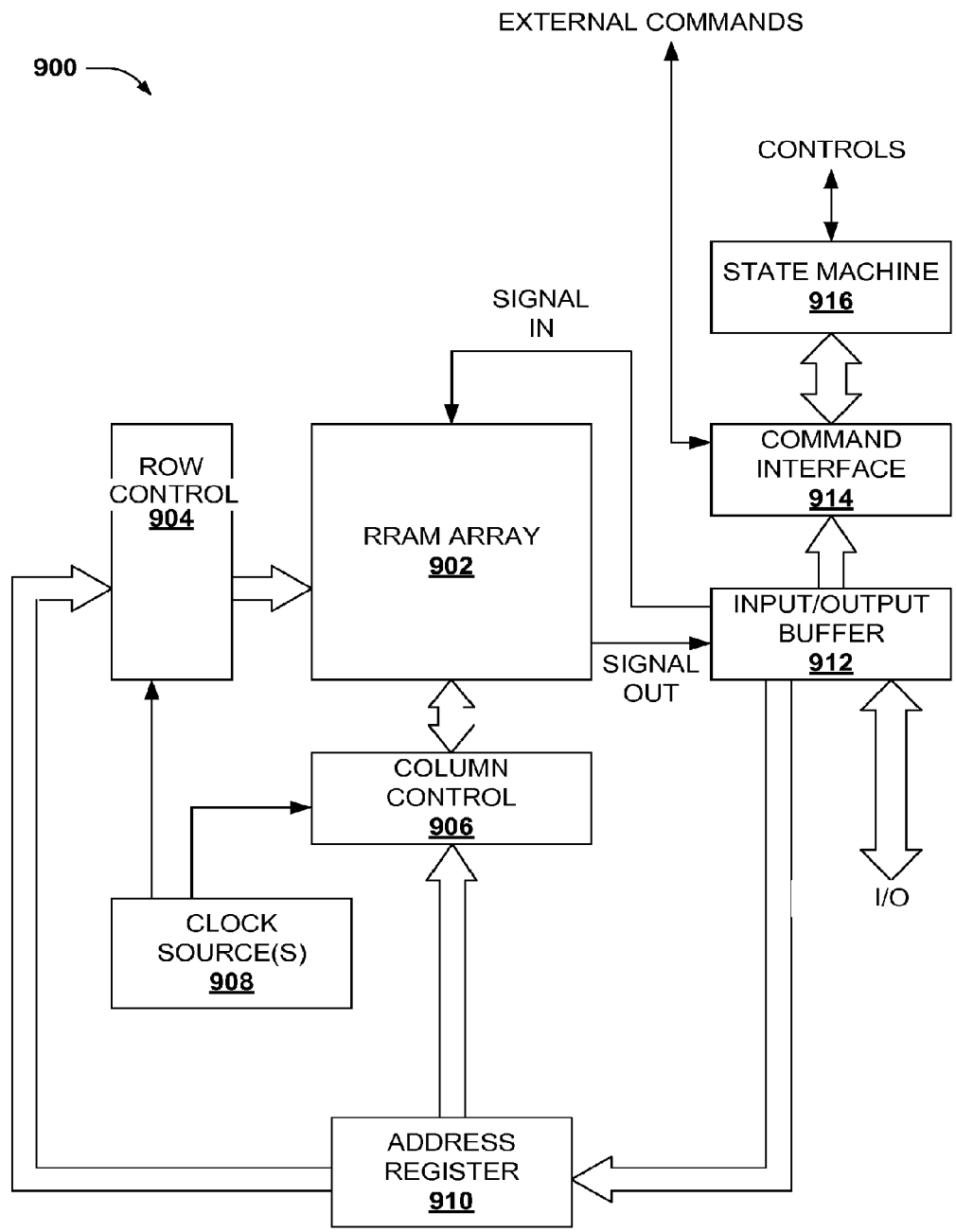
FIG. 9 illustrates a block diagram of an example electronic operating environment in accordance with certain embodiments of this disclosure.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 9 illustrates a block diagram of an example operating and control environment 900 for a RRAM array 902 according to aspects of the subject disclosure. In at least one aspect of the subject disclosure, RRAM array 902 can comprise a variety of RRAM memory cell technology. Particularly, RRAM array can be configured or operated to mitigate or avoid sneak path currents of the RRAM array, as described herein.

A column controller 906 can be formed adjacent to RRAM array 902. Moreover, column controller 906 can be electrically coupled with bit lines of RRAM array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of RRAM array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to RRAM array 902 via signal input lines, and output data is received from RRAM array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of RRAM array 902. State machine 916 receives commands from the host apparatus via input/output interface 912 and command interface 914, and manages read, write, erase, data input, data output, and like functionality associated with RRAM array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 8, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
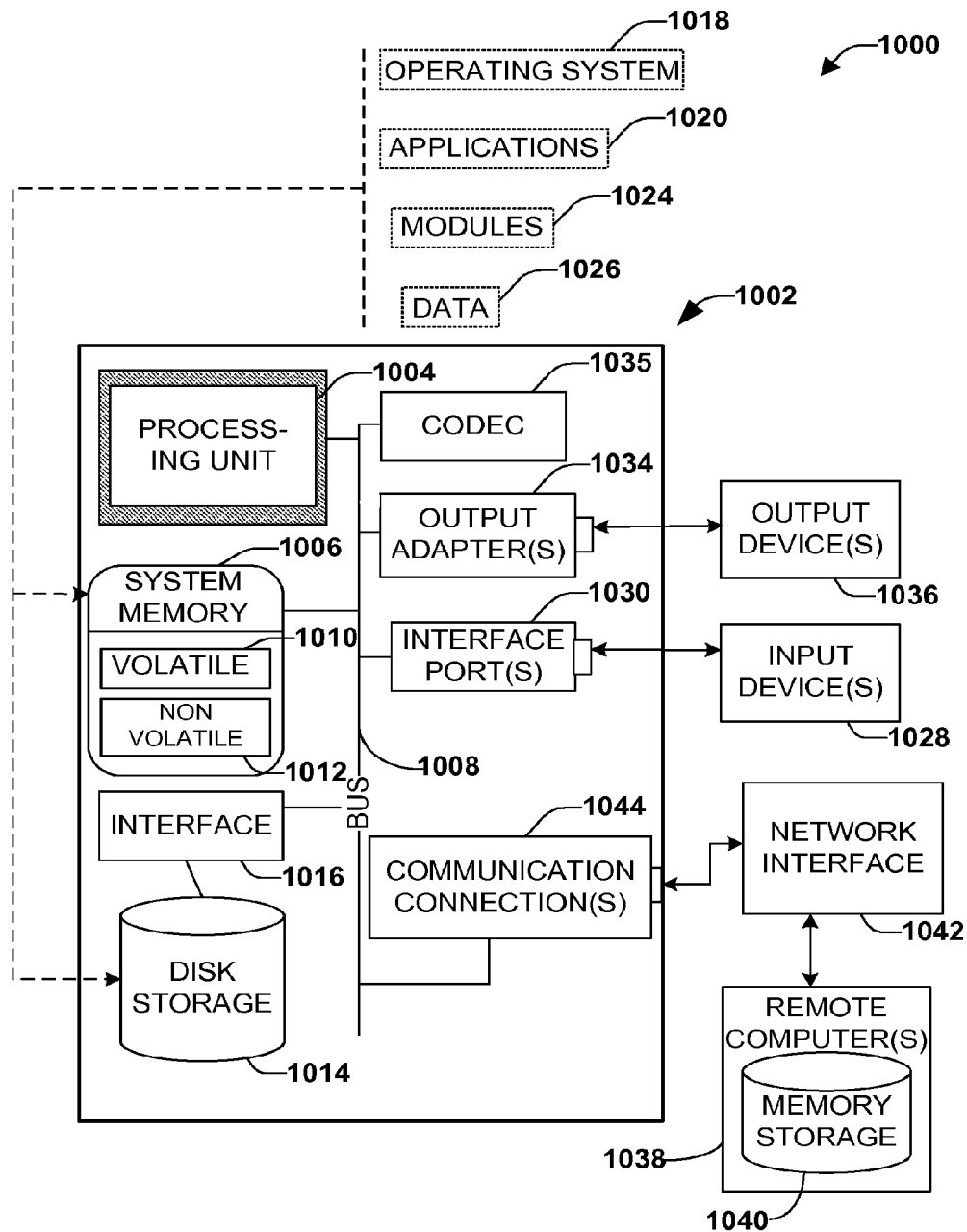
FIG. 10 illustrates an example schematic block diagram for a computing environment in accordance with certain embodiments of this disclosure.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit-switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A CMOS-compatible fabrication method for forming a semiconductor device, comprising:
    receiving a substrate comprising a plurality of CMOS devices and a first terminal comprising a conductive metal layer;
    forming a conductive layer adjacent to and in physical contact with the first terminal;
    depositing silicon in an ambient environment comprising oxygen to form an interface layer with a thickness in a range of about 1 nanometer to about 8 nanometers, wherein the interface layer is adjacent to and in physical contact with the conductive layer, wherein the interface layer comprises a silicon sub-oxide with a chemical formula of $SiO_x$, where $0<X<2$;
    depositing an active metal layer adjacent to and in contact with the interface layer;
    wherein the interface layer is at least partially permeable to ions of the active metal layer; and
    wherein a second terminal is coupled to the active metal layer.

2. The method of claim 1 wherein the depositing silicon in the ambient environment comprising oxygen to form the interface layer comprises depositing the silicon at a temperature within a range of about 100 C to about 500 C.

3. The method of claim 1 wherein the active metal layer comprises a material selected from a group consisting of: silver, a silver compound, gold, titanium, a titanium compound, chromium, a chromium compound, tantalum, a tantalum compound, iron, and an iron compound.

4. The method of claim 1 wherein the active metal layer comprises a material selected from a group consisting of: nickel, a nickel compound, aluminum, an aluminum compound, tungsten, and a tungsten compound.

5. The method of claim 1 wherein the first terminal comprises aluminum or copper.

6. The method of claim 1 wherein the silicon sub-oxide is characterized by a high resistive state or a low resistive state.

7. The method of claim 1 wherein the CMOS devices are selected from a group consisting of: control transistors and control logic.

8. The method of claim 1 wherein the conductive layer has a thickness within a range of about 20 nanometers to about 250 nanometers.

9. The method of claim 1 wherein the active metal layer has a thickness within a range of about 10 nanometers to about 100 nanometers.

10. The method of claim 1 wherein the conductive layer, the interface layer and the active metal layer have an aggregate thickness within a range of about 20 nanometers to about 300 nanometers.

11. A semiconductor device comprising:
a substrate comprising a plurality of CMOS devices and a first terminal;
a conductive layer adjacent to and in physical contact with the first terminal, wherein the first terminal comprises a conductive metal layer;
an interface layer with a thickness in a range of about 1 nanometer to about 8 nanometers adjacent to and in physical contact with the conductive layer, wherein the interface layer comprises a deposited silicon sub-oxide comprising a mixture of silicon-based compounds with a chemical formula of $SiO_x$, where X is a non-integer greater than zero and less than two;
an active metal layer adjacent to and in contact with the interface layer;
wherein ions of metal from the active metal layer are disposed within the interface layer; and
a second terminal adjacent to and in contact with the active metal layer.

12. The semiconductor device of claim 11 wherein the active metal layer comprises a material selected from a group consisting of: silver, a silver compound, gold, titanium, a titanium compound, chromium, a chromium compound, tantalum, a tantalum compound, iron, and an iron compound.

13. The semiconductor device of claim 11 wherein the active metal layer comprises a material selected from a group consisting of: nickel, a nickel compound, aluminum, an aluminum compound, tungsten, and a tungsten compound.

14. The semiconductor device of claim 11 wherein the first terminal comprises aluminum or copper.

15. The semiconductor device of claim 11 wherein the ions of the metal reversibly form a conductive filament within the interface layer.

16. The semiconductor device of claim 11 wherein the interface layer is characterized by a low resistive state in response to the ions of the metal from the active metal layer.

17. The semiconductor device of claim 11 wherein the conductive layer has a thickness within a range of about 20 nanometers to about 250 nanometers.

18. The semiconductor device of claim 11 wherein the active metal layer has a thickness within a range of about 10 nanometers to about 100 nanometers.

19. The semiconductor device of claim 11 wherein the conductive layer, the interface layer and the active metal layer have an aggregate thickness within a range of about 20 nanometers to about 300 nanometers.

20. The semiconductor device of claim 11 wherein the interface layer is at least partially permeable to ions of the active metal layer.

* * * * *